United States Patent
Li et al.

(10) Patent No.: US 6,800,504 B2
(45) Date of Patent: Oct. 5, 2004

(54) INTEGRATED CIRCUIT DEVICE AND FABRICATION USING METAL-DOPED CHALCOGENIDE MATERIALS

(75) Inventors: Jiutao Li, Boise, ID (US); Allen McTeer, Eagle, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/285,463

(22) Filed: Nov. 1, 2002

(65) Prior Publication Data

US 2003/0068862 A1 Apr. 10, 2003

Related U.S. Application Data

(62) Division of application No. 09/943,426, filed on Aug. 30, 2001.

(51) Int. Cl.[7] .................. H01L 21/06; H01L 21/00; H01L 21/20; H01L 21/26

(52) U.S. Cl. .................. 438/102; 438/84; 438/85; 438/104; 438/393; 438/513; 438/798; 438/799

(58) Field of Search .......................... 438/84, 85, 102, 438/104, 393, 394, 513, 799, 798

(56) References Cited

U.S. PATENT DOCUMENTS

| | | |
|---|---|---|
| 3,622,319 A | 11/1971 | Sharp |
| 3,743,847 A | 7/1973 | Boland |
| 3,773,529 A | 11/1973 | Plumat |
| 3,820,150 A | 6/1974 | Nicolaides |
| 4,089,714 A | 5/1978 | Johnson et al. |
| 4,132,614 A | 1/1979 | Cuomo et al. |
| 4,203,123 A | 5/1980 | Shanks |
| 4,269,935 A | 5/1981 | Masters et al. |

(List continued on next page.)

FOREIGN PATENT DOCUMENTS

| | | | | |
|---|---|---|---|---|
| DE | 202896 | * 10/1983 | ........... | C23C/11/00 |
| GB | 2331765 | 2/1999 | | |
| JP | 56126916 | 10/1981 | | |
| JP | 9-153598 | * 6/1997 | ......... | H01L/27/108 |
| WO | WO 97/48032 | 12/1997 | | |
| WO | WO 99/28914 | 6/1999 | | |
| WO | WO 00/48196 | 8/2000 | | |
| WO | WO 02/21542 | 3/2002 | | |

OTHER PUBLICATIONS

Abdel–All, A.; Elshafie,A.; Elhawary, M.M., DC electric–field effect in bulk and thin–film Ge5As38Te57 chalcogenide glass, Vacuum 59 (2000) 845–853.

Adler, D.; Moss, S.C., Amorphous memories and bistable switches, J. Vac. Sci. Technol. 9 (1972) 1182–1189.

(List continued on next page.)

*Primary Examiner*—Carl Whitehead, Jr.
*Assistant Examiner*—David L. Hogans
(74) *Attorney, Agent, or Firm*—Dickstein Shapiro Morin & Oshinsky LLP

(57) ABSTRACT

Methods of forming metal-doped chalcogenide layers and devices containing such doped chalcogenide layers include using a plasma to induce diffusion of metal into a chalcogenide layer concurrently with metal deposition. The plasma contains at least one noble gas of low atomic weight, such as neon or helium. The plasma has a sputter yield sufficient to sputter a metal target and a UV component of its emitted spectrum sufficient to induce diffusion of the sputtered metal into the chalcogenide layer. Using such methods, a conductive layer can be formed on the doped chalcogenide layer in situ. In integrated circuit devices, such as non-volatile chalcogenide memory devices, doping of the chalcogenide layer concurrently with metal deposition and formation of a conductive layer in situ with the doping of the chalcogenide layer reduces contamination concerns and physical damage resulting from moving the device substrate from tool to tool, thus facilitating improved device reliability.

22 Claims, 7 Drawing Sheets

U.S. PATENT DOCUMENTS

| | | |
|---|---|---|
| 4,276,368 A | 6/1981 | Heller et al. |
| 4,312,938 A | 1/1982 | Drexler et al. |
| 4,316,946 A | 1/1982 | Masters et al. |
| 4,320,191 A | 3/1982 | Yoshikawa et al. |
| 4,332,879 A | 6/1982 | Pastor et al. |
| 4,350,541 A | 9/1982 | Mizushima et al. |
| 4,371,608 A | 2/1983 | Das |
| 4,405,710 A | 9/1983 | Balasubramanyam et al. |
| 4,419,421 A | 12/1983 | Wichelhaus et al. |
| 4,454,221 A | 6/1984 | Chen et al. |
| 4,499,557 A | 2/1985 | Holmberg et al. |
| 4,506,005 A | 3/1985 | Lis |
| 4,550,074 A | 10/1985 | Tzinis et al. |
| 4,671,618 A | 6/1987 | Wu et al. |
| 4,795,657 A | 1/1989 | Formigonl et al. |
| 4,800,526 A | 1/1989 | Lewis |
| 4,818,717 A | 4/1989 | Johnson et al. |
| 4,847,674 A | 7/1989 | Sliwa et al. |
| 5,151,384 A | 9/1992 | Williams |
| 5,170,091 A | 12/1992 | Wekhof |
| 5,177,567 A | 1/1993 | Klersy et al. |
| 5,219,788 A | 6/1993 | Abernathey et al. |
| 5,238,862 A | 8/1993 | Blalock et al. |
| 5,272,359 A | 12/1993 | Nagasubramanian et al. |
| 5,314,772 A | 5/1994 | Kozicki |
| 5,315,131 A | 5/1994 | Kishimoto et al. |
| 5,335,219 A | 8/1994 | Ovshinsky et al. |
| 5,350,484 A | 9/1994 | Gardner et al. |
| 5,359,205 A | 10/1994 | Ovshinsky |
| 5,360,981 A | 11/1994 | Owen et al. |
| 5,364,434 A | 11/1994 | Sanghera et al. |
| 5,414,271 A | 5/1995 | Ovshinsky et al. |
| 5,500,532 A | 3/1996 | Kozicki |
| 5,512,328 A | 4/1996 | Yoshimura et al. |
| 5,512,773 A | 4/1996 | Wolf et al. |
| 5,596,522 A | 1/1997 | Ovshinsky et al. |
| 5,682,041 A | 10/1997 | Kawakubo et al. |
| 5,714,768 A * | 2/1998 | Ovshinsky et al. ........... 257/40 |
| 5,726,083 A | 3/1998 | Takaishi |
| 5,750,012 A | 5/1998 | Ireland et al. |
| 5,751,012 A | 5/1998 | Wolstenholme et al. |
| 5,761,115 A * | 6/1998 | Kozicki et al. ............. 365/182 |
| 5,789,277 A | 8/1998 | Zahorik et al. |
| 5,807,467 A | 9/1998 | Givens et al. |
| 5,825,046 A | 10/1998 | Czubatyj et al. |
| 5,837,564 A | 11/1998 | Sandhu et al. |
| 5,841,150 A | 11/1998 | Gonzalez et al. |
| 5,846,889 A | 12/1998 | Harblson et al. |
| 5,869,843 A | 2/1999 | Harshfield |
| 5,883,827 A | 3/1999 | Morgan |
| 5,896,312 A | 4/1999 | Kozicki et al. |
| 5,914,893 A | 6/1999 | Kozicki et al. |
| 5,920,788 A | 7/1999 | Reinberg |
| 5,952,671 A | 9/1999 | Reinberg |
| 5,985,486 A * | 11/1999 | Giron ........................ 429/188 |
| 5,998,066 A | 12/1999 | Block et al. |
| 5,998,244 A | 12/1999 | Wolstenholme et al. |
| 6,013,159 A | 1/2000 | Adams et al. |
| 6,039,850 A * | 3/2000 | Schulz .................. 204/192.15 |
| 6,072,716 A | 6/2000 | Jacobson et al. |
| 6,077,729 A | 6/2000 | Harshfield |
| 6,080,665 A | 6/2000 | Chen et al. |
| 6,084,796 A | 7/2000 | Kozicki et al. |
| 6,087,689 A | 7/2000 | Reinberg |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,118,135 A | 9/2000 | Gonzalez et al. |
| 6,126,740 A | 10/2000 | Schulz et al. |
| 6,143,124 A | 11/2000 | Ahn |
| 6,143,604 A | 11/2000 | Chiang et al. |
| 6,147,395 A | 11/2000 | Gilgen |
| 6,150,253 A | 11/2000 | Doan et al. |
| 6,153,890 A | 11/2000 | Wolstenholme et al. |
| 6,177,338 B1 | 1/2001 | Liaw et al. |
| 6,187,151 B1 | 2/2001 | Leiphart |
| 6,187,682 B1 | 2/2001 | Denning et al. |
| 6,189,582 B1 | 2/2001 | Reinberg et al. |
| 6,236,059 B1 | 5/2001 | Wolstenholme et al. |
| 6,297,170 B1 | 10/2001 | Gabriel et al. |
| 6,300,684 B1 | 10/2001 | Gonzalez et al. |
| 6,316,784 B1 | 11/2001 | Zahorik et al. |
| 6,329,606 B1 | 12/2001 | Freyman et al. |
| 6,335,069 B1 * | 1/2002 | Ogawa et al. ............. 428/64.1 |
| 6,340,603 B1 | 1/2002 | Bell |
| 6,348,365 B1 | 2/2002 | Moore et al. |
| 6,350,679 B1 | 2/2002 | McDaniel et al. |
| 6,376,284 B1 | 4/2002 | Gonzalez et al. |
| 6,388,324 B2 | 5/2002 | Kozicki |
| 6,391,688 B1 | 5/2002 | Gonzalez et al. |
| 6,414,376 B1 | 7/2002 | Thakur et al. |
| 6,418,049 B1 | 7/2002 | Kozicki et al. |
| 6,423,628 B1 | 7/2002 | Li et al. |
| 6,469,364 B1 | 10/2002 | Kozicki |
| 6,487,106 B1 | 11/2002 | Kozicki |
| 2002/0000666 A1 | 1/2002 | Kozicki et al. |
| 2002/0072188 A1 | 6/2002 | Gilton |
| 2002/0106849 A1 | 8/2002 | Moore |
| 2002/0123169 A1 | 9/2002 | Moore et al. |
| 2002/0123170 A1 | 9/2002 | Moore et al. |
| 2002/0123248 A1 | 9/2002 | Moore et al. |
| 2002/0127886 A1 | 9/2002 | Moore et al. |
| 2002/0163828 A1 | 11/2002 | Krieger et al. |
| 2002/0168820 A1 | 11/2002 | Kozicki et al. |
| 2002/0190350 A1 | 12/2002 | Kozicki |
| 2003/0001229 A1 | 1/2003 | Moore et al. |
| 2003/0027416 A1 | 2/2003 | Moore |

OTHER PUBLICATIONS

Adler, D.; Henisch, H.K.; Mott, S.N., The mechanism of threshold switching in amorphous alloys, Rev. Mod. Phys. 50 (1978) 209–220.

Afifi, M.A.; Labib, H.H.; El–Fazary, M.H.; Fadel, M., Electrical and thermal properties of chalcogenide glass system Se75Ge25–xSbx, Appl. Phys. A 55 (1992) 167–169.

Afifi,M.A.; Labib, H.H.; Fouad, S.S.; El–Shazly, A.A., Electrical & thermal conductivity of the amorphous semiconductor GexSe1–x, Egypt, J. Phys. 17 (1986) 335–342.

Alekperova, Sh.M.; Gadzhieva, G.S., Current–Voltage characteristics of Ag2Se single crystal near the phase transition, Inorganic Materials 23 (1987) 137–139.

Aleksiejunas, A.; Cesnys, A., Switching phenomenon and memory effect in thin–film heterojunction of polycrystalline selenium–silver selenide, Phys. Stat. Sol. (a) 1973) K169–K171.

Angell, C.A., Mobile ions in amorphous solids, Annu. Rev. Phys. Chem. 43 (1992) 693–717.

Aniya, M., Average electronegativity, medium–range–order, and ionic conductivity in superionic glasses, Solid state Ionics 136–137 (2000) 1085–1089.

Asahara, Y.; Izumitani, T., Voltage controlled switching in Cu—As—Se compositions, J. Non–Cryst. Solids 11 (1972) 97–104.

Asokan, S.; Prasad, M.V.N.; Parthasarathy, G.; Gopal, E.S.R., Mechanical and chemical thresholds in IV–VI chalcogenide glasses, Phys. Rev. Lett. 62 (1989) 808–810.

Baranovskii, S.D.; Cordes, H., On the conduction mechanism in ionic glasses, J. Chem. Phys. 111 (1999) 7546–7557.

Belin, R.; Taillades, G.; Pradel, A.; Ribes, M., Ion dynamics in superionic chalcogenide glasses: complete conductivity spectra, Solid state Ionics 136–137 (2000) 1025–1029.

Belin, R.; Zerouale, A.; Pradel, A.; Ribes, M., Ion dynamics in the argyrodite compound Ag7GeSe5I: non–Arrhenius behavior and complete conductivity spectra, Solid State Ionics 143 (2001) 445–455.

Benmore, C.J.; Salmon, P.S., Structure of fast ion conducting and semiconducting glassy chalcogenide alloys, Phys. Rev. Lett. 73 (1994) 264–267.

Bernede, J.C., Influence du metal des electrodes sur les caracteristiques courant–tension des structures M—Ag2Se—M, Thin solid films 70 (1980) L1–L4.

Bernede, J.C., Polarized memory switching in MIS thin films, Thin Solid Films 81 (1981) 155–160.

Bernede, J.C., Switching and silver movements in Ag2Se thin films, Phys. Stat. Sol. (a) 57 (1980) K101–K104.

Bernede, J.C.; Abachi, T., Differential negative resistance in metal/insulator/metal structures with an upper bilayer electrode, Thin solid films 131 (1985) L61–L64.

Bernede, J.C.; Conan, A.; Fousenan't, E.; El Bouchairi, B.; Goureaux, G., Polarized memory switching effects in Ag2Se/Se/M thin film sandwiches, Thin solid films 97 (1982) 165–171.

Bernede, J.C.; Khelil, A.; Kettaf, M.; Conan, A., Transition from S– to N–type differential negative resistance in Al—Al2O3—Ag2–xSe1+x thin film structures, Phys. Stat. Sol. (a) 74 (1982) 217–224.

Bondarev, V.N.; Pikhitsa, P.V., A dendrite model of current instability in RbAg4I5, Solid State Ionics 70/71 (1994) 72–76.

Boolchand, P., The maximum in glass transition temperature (Tg) near x=1/3 in GexSe1–x Glasses, Asian Journal of Physics (2000) 9, 709–72.

Boolchand, P.; Bresser, W.J., Mobile silver ions and glass formation in solid electrolytes, Nature 410 (2001) 1070–1073.

Boolchand, P.; Georgiev, D.G.; Goodman, B., Discovery of the Intermediate Phase in Chalcogenide Glasses, J. Optoelectronics and Advanced Materials, 3 (2001), 703.

Boolchand, P.; Selvanathan, D.; Wang, Y.; Georgiev, D.G.; Bresser, W.J., Onset of rigidity in steps in chalcogenide glasses, Properties and Applications of Amorphous Materials, M.F. Thorpe and Tichy, L. (eds.) Kluwer Academic Publishers, the Netherlands, 2001, pp. 97–132.

Boolchand, P.; Enzweiler, R.N.; Tenhover, M., Structural ordering of evaporated amorphous chalcogenide alloy films: role of thermal annealing, Diffusion and Defect Data vol. 53–54 (1987) 415–420.

Boolchand, P.; Grothaus, J.; Bresser, W.J.; Suranyi, P., Structural origin of broken chemical order in a GeSe2 glass, Phys. Rev. B 25 (1982) 2975–2978.

Boolchand, P.; Grothaus, J.; Phillips, J.C., Broken chemical order and phase separation in GexSe1–x glasses, Solid state comm. 45 (1983) 183–185.

Boolchand, P., Bresser, W.J., Compositional trends in glass transition temperature (Tg), network connectivity and nanoscale chemical phase separation in chalcogenides, Dept. of ECECS, Univ. Cincinnati (Oct. 28, 1999) 45221–0030.

Boolchand, P.; Grothaus, J, Molecular Structure of Melt–Quenched GeSe2 and GeS2 glasses compared, Proc. Int. Conf. Phys. Semicond. (Eds. Chadi and Harrison) 17$^{th}$ (1985) 833–36.

Bresser, W.; Boolchand, P.; Suranyi, P., Rigidity percolation and molecular clustering in network glasses, Phys. Rev. Lett. 56 (1986) 2493–2496.

Bresser, W.J.; Boolchand, P.; Suranyi, P.; de Neufville, J.P, Intrinsically broken chalcogen chemical order in stoichiometric glasses, Journal de Physique 42 (1981) C4–193–C4–196.

Bresser, W.J.; Boolchand, P.; Suranyi, P.; Hernandez, J.G., Molecular phase separation and cluster size in GeSe2 glass, Hyperfine Interactions 27 (1986) 389–392.

Cahen, D.; Gilet, J.–M.; Schmitz, C.; Chernyak, L.; Gartsman, K.; Jakubowicz, A., Room–Temperature, electric field induced creation of stable devices in CuInSe2 Crystals, Science 258 (1992) 271–274.

Chatterjee, R.; Asokan, S.; Titus, S.S.K., Current–controlled negative–resistance behavior and memory switching in bulk As—Te—Se glasses, J. Phys. D: Appl. Phys. 27 (1994) 2624–2627.

Chen, C.H.; Tai, K.L., Whisker growth induced by Ag photodoping in glassy GexSe1–x films, Appl. Phys. Lett. 37 (1980) 1075–1077.

Chen, G.; Cheng, J., Role of nitrogen in the crystallization of silicon nitride–doped chalcogenide glasses, J. Am. Ceram. Soc. 82 (1999) 2934–2936.

Chen, G.; Cheng, J.; Chen, W., Effect of Si3N4 on chemical durability of chalcogenide glass, J. Non–Cryst. Solids 220 (1997) 249–253.

Cohen, M.H.; Neale, R.G.; Paskin, A., A model for an amorphous semiconductor memory device, J. Non–Cryst. Solids 8–10 (1972) 885–891.

Croitoru, N.; Lazarescu, M.; Popescu, C.; Telnic, M.; and Vescan, L., Ohmic and non–ohmic conduction in some amorphous semiconductors, J. Non–Cryst. Solids 8–10 (1972) 781–786.

Dalven, R.; Gill, R., Electrical properties of beta–Ag2Te and beta–Ag2Se from 4.2 to 300K, J. Appl. Phys. 38 (1967) 753–756.

Davis, E.A., Semiconductors without form, Search 1 (1970) 152–155.

Dearnaley, G.; Stoneham, A.M.; Morgan, D.V., Electrical phenomena in amorphous oxide films, Rep. Prog. Phys 33 (1970) 1129–1191.

Dejus, R.J.; Susman, S.; Volin, K.J.; Montague, D.G.; Price, D.L., Structure of Vitreous Ag—Ge—Se, J. Non–Cryst. Solids 143 (1992) 162–180.

den Boer, W., Threshold switching in hydrogenated amorphous silicon, Appl. Phys. Lett. 40 (1982) 812–813.

Drusedau, T.P.; Panckow, A.N.; Klabunde, F., The hydrogenated amorphous silicon/nanodisperse metal (SIMAL) system–Films of unique electronic properties, J. Non–Cryst. Solids 198–200 (1996) 829–832.

El Bouchairi, B.; Bernede, J.C.; Burgaud, P., Properties of Ag2–xSe1+x/n——Si diodes, Thin Solid Films 110 (1983) 107–113.

El Gharras, Z.; Bourahla, A.; Vautier, C., Role of photoinduced defects in amorphous GexSe1–x photoconductivity, J. Non–Cryst. Solids 155 (1993) 171–179.

El Ghrandi, R.; Calas, J.; Galibert, G.; Averous, M., Silver photodissolution in amorphous chalcogenide thin films, Thin Solid Films 218 (1992)259–273.

El Ghrandi, R.; Calas, J.; Galibert, G., Ag dissolution kinetics in amorphous GeSe5.5 thin films from "in–situ" resistance measurements vs time, Phys. Stat. Sol. (a) 123 (1991) 451–460.

El–kady, Y.L., The threshold switching in semiconducting glass Ge21Se17Te62, Indian J. Phys. 70A (1996) 507–516.

Elliott, S.R., A unified mechanism for metal phosphodissolution in amorphous chalcogenide materials, J. Non–Cryst. Solids 130 (1991) 85–97.

Elliott, S.R., Photodissolution of metals in chalcogenide glasses: A unified mechanism, J. Non–Cryst. Solids 137–138 (1991) 1031–1034.

Elsamanoudy, M.M.; Hegab, N.A.; Fadel, M., Conduction mechanism in the pre–switching state of thin films containing Te As Ge Si, Vacuum 46 (1995) 701–707.

El–Zahed, H.; El–Korashy, A., Influence of composition on the electrical and optical properties of Ge20BixSe80–xfilms, Thin Solid Films 376 (2000) 236–240.

Fadel, M., Switching phenomenon in evaporated Se—Ge—As thin films of amorphous chalcogenide glass, Vacuum 44 (1993) 851–855.

Fadel, M., El–Shair, H.T., Electrical, thermal and optical properties of Se75Ge7Sb18, Vacuum 43 (1992) 253–257.

Feng, X. ;Bresser, W.J.; Boolchand, P., Direct evidence for stiffness threshold in Chalcogenide glasses, Phys. Rev. Lett. 78 (1997) 4422–4425.

Feng, X.; Bresser, W.J.; Zhang, M.; Goodman, B.; Boolchand, P., Role of network connectivity on the elastic, plastic and thermal behavior of covalent glasses, J. Non–Cryst. Solids 222 (1997) 137–143.

Fischer–Colbrie, A.; Bienenstock, A.; Fuoss, P.H.; Marcus, M.A., Structure and bonding in photodiffused amorphous Ag—GeSe2 thin films, Phys. Rev. B 38 (1988) 12388–12403.

Fleury, G.; Hamou, V.; Viger, C.; Vautier, C., Conductivity and crystallization of amorphous selenium, Phys. Stat. Sol. (a) 64 (1981) 311–316.

Fritzsche, H, Optical and electrical energy gaps in amorphous semiconductors, J. Non–Cryst. Solids 6 (1971) 49–71.

Fritzche, H., Electronic phenomena in amorphous semiconductors, Annual Review of Materials Science 2 (1972) 697–744.

Gates, B.; Wu, Y.; Yin, Y.; Yang, P.; Xia, Y., Single–crystalline nanowires of Ag2Se can be synthesized by templating against nanowires of trigonal Se, J. Am. Chem. Soc. (2001) currently ASAP.

Gosain, D.P.; Nakamura, M.; Shimizu, T.; Suzuki, M.; Okano, S., Nonvolatile memory based on reversible phase transition phenomena in telluride glasses, Jap. J. Appl. Phys. 28 (1989) 1013–1018.

Guin, J.–P.; Rouxel, T.; Keryvin, V.; Sangleboeuf, J.–C.; Serre, I.; Lucas, J., Identation creep of Ge—Se chalcogenide glasses below Tg: elastic recovery and non–Newtonian flow, J. Non–Cryst. Solids 298 (2002) 260–269.

Guin, J.–P.; Rouxel, T.; Sangleboeuf, J.–C.; Melscoet, I.; Lucas, J., Hardness, toughness and scratchability of germanium–selenium chalcogenide glasses, J. Am. Ceram. Soc. 85 (2002) 1545–52.

Gupta, Y.P., On electrical switching and memory effects in amorphous chalcogenides, J. Non–Cryst. Sol. 3 (1970) 148–154.

Haberland, D.R.; Stiegler, H., New experiments on the charge–controlled switching effect in amorphous semiconductors, J. Non–Cryst. Solids 8–10 (1972) 408–414.

Haifz, M.M.; Ibrahim, M.M.; Dongol, M.; Hammad, F.H., Effect of composition on the structure and electrical properties of As—Se—Cu glasses, J. Apply. Phys. 54 (1983) 1950–1954.

Hajto, J.; Rose, M.J.; Osborne, I.S.; Snell, A.J.; Le Comber, P.G.; Owen, A.E., Quantization effects in metal/a–Si:H/metal devices, Int. J. Electronics 73 (1992) 911–913.

Hajto, J.; Hu, J.; Snell, A.J.; Turvey, K.; Rose, M., DC and AC measurements on metal/a–Si:H/metal room temperature quantised resistance devices, J. Non–Cryst. Solids 266–269 (2000) 1058–1061.

Hajto, J.; McAuley, B.; Snell, A.J.; Owen, A.E., Theory of room temperature quantized resistance effects in metal–a–Si:H–metal thin film structures, J. Non–Cryst. Solids 198–200 (1996) 825–828.

Hajto, J.; Owen, A.E.; Snell, A.J.; Le Comber, P.G.; Rose, M.J., Analogue memory and ballistic electron effects in metal–amorphous silicon structures, Phil. Mag. B 63 (1991) 349–369.

Hayashi, T.; Ono, Y.; Fukaya, M.; Kan, H., Polarized memory switching in amorphous Se film, Japan J. Appl. Phys. 13 (1974) 1163–1164.

Hegab, N.A.; Fadel, M.; Sedeek, K., Memory switching phenomena in thin films of chalcogenide semiconductors, Vacuum 45 (1994) 459–462.

Hirose, Y.; Hirose, H., Polarity–dependent memory switching and behavior of Ag dendrite in Ag–photodoped amorphous As2S3 films, J. Appl. Phys. 47 (1976) 2767–2772.

Hong, K.S.; Speyer, R.F., Switching behavior in II–IV–V2 amorphous semiconductor systems, J. Non–Cryst. Solids 116 (1990) 191–200.

Hosokawa, S., Atomic and electronic structures of glassy GexSe1-x around the stiffness threshold composition, J. Optoelectronics and Advanced Materials 3 (2001) 199–214.

Hu, J.; Snell, A.J.; Hajto, J.; Owen, A.E., Constant current forming in Cr/p+a–/Si:H/V thin film devices, J. Non–Cryst. Solids 227–230 (1998) 1187–1191.

Hu, J.; Hajto, J.; Snell, A.J.; Owen, A.E.; Rose, M.J., Capacitance anomaly near the metal–non–metal transition in Cr–hydrogenated amorphous Si–V thin–film devices, Phil. Mag. B 74 (1996) 37–50.

Hu, J.; Snell, A.J.; Hajto, J.; Owen, A.E., Current–induced instability in Cr–p+a–Si:H–V thin film devices, Phil. Mag. B 80 (2000) 29–43.

Iizima, S.; Sugi, M.; Kikuchi, M.; Tanaka, K., Electrical and thermal properties of semiconducting glasses As—Te—Ge, Solid State Comm. 8 (1970) 153–155.

Ishikawa, R.; Kikuchi, M., Photovoltaic study on the photo–enhanced diffusion of Ag in amorphous films of Ge2S3, J. Non–Cryst. Solid 35 & 36 (1980) 1061–1066.

Iyetomi, H.; Vashishta, P.; Kalia, R.K., Incipient phase separation in Ag/Ge/Se glasses: clustering of Ag atoms, J. Non–Cryst. Solids 262 (2000) 135–142.

Jones, G.; Collins, R.A., Switching properties of thin selenium films under pulsed bias, Thin Solid Films 40 (1977) L15–L18.

Joullie, A.M.; Marucchi, J., On the DC electrical conduction of amorphous As2Se7 before switching, Phys. Stat. Sol. (a) 13 (1972) K105–K109.

Joullie, A.M.; Marucchi, J., Electrical properties of the amorphous alloy As2Se5, Mat. Res. Bull. 8 (1973) 433–442.

Kaplan, T.; Adler, D., Electrothermal switching in amorphous semiconductors, J. Non–Cryst. Solids 8–10 (1972) 538–543.

Kawaguchi, T.; Maruno, S.; Elliott, S.R., Optical, electrical, and structural properties of amorphous Ag—Ge—S and Ag—Ge—Se films and comparison of photoinduced and thermally induced phenomena of both systems, J. Appl. Phys. 79 (1996) 9096–9104.

Kawaguchi, T.; Masui, K., Analysis of change in optical transmission spectra resulting from Ag photodoping in chalcogenide film, Japn. J. Appl. Phys. 26 (1987) 15–21.

Kawasaki, M.; Kawamura, J.; Nakamura, Y.; Aniya, M., Ionic conductivity of Agx(GeSe3)1-x (0<=x<=0.571) glasses, Solid state Ionics 123 (1999) 259–269.

Kluge, G.; Thomas, A.; Klabes, R.; Grotzschel, R., Silver photodiffusion in amorphous GexSe100-x, J. Non–Cryst. Solids 124 (1990) 186–193.

Kolobov, A.V., On the origin of p–type conductivity in amorphous chalcogenides, J. Non–Cryst. Solids 198–200 (1996) 728–731.

Kolobov, A.V., Lateral diffusion of silver in vitreous chalcogenide films, J. Non–Cryst. Solids 137–138 (1991) 1027–1030.

Korkinova, Ts.N.; Andreichin,R.E., Chalcogenide glass polarization and the type of contacts, J. Non–Cryst. Solids 194 (1996) 256–259.

Kotkata, M.F.; Afif, M.A.; Labib, H.H.; Hegab, N.A.; Abdel–Aziz, M.M., Memory switching in amorphous GeSeTl chalcogenide semiconductor films, Thin Solid Films 240 (1994) 143–146.

Lakshminarayan, K.N.; Srivastava K.K.; Panwar, O.S.; Dumar, A., Amorphous semiconductor devices: memory and switching mechanism, J. Instn Electronics & Telecom. Engrs 27 (1981) 16–19.

Lal, M.; Goyal, N., Chemical bond approach to study the memory and threshold switching chalcogenide glasses, Indian Journal of pure & appl. phys. 29 (1991) 303–304.

Leimer, F.; Stotzel, H.; Kottwitz, A., Isothermal electrical polarisation of amorphous GeSe films with blocking Al contacts influenced by Poole–Frenkel conduction, Phys. Stat. Sol. (a) 29 (1975) K129–K132.

Leung, W.; Cheung, N.; Neureuther, A.R., Photoinduced diffusion of Ag in GexSe1-x glass, Appl. Phys. Lett. 46 (1985) 543–545.

Matsushita, T.; Yamagami, T.; Okuda, M., Polarized memory effect observed on Se—SnO2 system, Jap. J. Appl. Phys. 11 (1972) 1657–1662.

Matsushita, T.; Yamagami, T.; Okuda, M., Polarized memory effect observed on amorphous selenium thin films, Jpn. J. Appl. Phys. 11 (1972) 606.

Mazurier, F.; Levy, M.; Souquet, J.L, Reversible and irreversible electrical switching in TeO2–V205 based glasses, Journal de Physique IV 2 (1992) C2–185–C2–188.

Messoussi, R.; Bernede, J.C.; Benhida, S.; Abachi, T.; Latef, A., Electrical characterization of M/Se structures (M=Ni,Bi) Mat. Chem. And Phys. 28 (1991) 253–258.

Mitkova, M.; Boolchand, P., Microscopic origin of the glass forming tendency in chalcogenides and constraint theory, J. Non–Cryst. Solids 240 (1998) 1–21.

Mitkova, M.; Kozicki, M.N., Silver incorporation in Ge—Se glasses used in programmable metallization cell devices, J. Non–Cryst. Solids 299–302 (2002) 1023–1027.

Mitkova, M.; Wang, Y.; Boolchand, P., Dual chemical role of Ag as an additive in chalcogenide glasses, Phys. Rev. Lett. 83 (1999) 3848–3851.

Miyatani, S.–y., Electronic and ionic conduction in (AgxCu1-x)2Se, J. Phys. Soc. Japan 34 (1973) 423–432.

Miyatani, S.–y., Electrical properties of Ag2Se, J. Phys. Soc. Japan 13 (1958) 317.

Miyatani, S.–y., Ionic conduction in beta–Ag2Te and beta–Ag2Se, Journal Phys. Soc. Japan 14 (1959) 996–1002.

Mott, N.F., Conduction in glasses containing transition metal ions. J. Non–Cryst. Solids 1 (1968) 1–17.

Nakayama, K.; Kitagawa, T.; Ohmura, M.; Suzuki, M., Nonvolatile memory based on phase transitions in chalcogenide thin films, Jpn. J. Appl. Phys. 32 (1993) 564–569.

Nakayama, K.; Kojima, K.; Hayakawa, F.; Imai, Y.; Kitagawa, A.; Suzuki, M., Submicron nonvolatile memory cell based on reversible phase transition in chalcogenide glasses, Jpn. J. Appl. Phys. 39 (2000) 6157–6161.

Nang, T.T.; Okuda, M.; Matsushita, T.; Yokota, S.; Suzuki, A., Electrical and optical parameters of GexSe1-x amorphous thin films, Jap. J. App. Phys. 15 (1976) 849–853.

Narayan, R.A.; Asokan, S.; Kumar, A., Evidence concerning the effect of topology on electrical switching in chalcogenide network glasses, Phys. Rev. B 54 (1996) 4413–4415.

Neale, R.G.; Aseltine, J.A., The application of amorphous materials to computer memories, IEEE transactions on electron dev. Ed.–20 (1973) 195–209.

Ovshinsky, S.R.; Fritzche, H., Reversible structural transformations in amorphous semiconductors for memory and logic, Mettalurgical transactions 2 (1971) 641–645.

Ovshinsky, S.R., Reversible electrical switching phenomena in disordered structures, Phys. Rev. Lett. 21 (1968) 1450–1453.

Owen, A.E.; LeComber, P.G.; Sarrabayrouse, G.; Spear, W.E., New amorphous–silicon electrically programmable nonvolatile switching device, IEE Proc. 129 (1982) 51–54.

Owen, A.E.; Firth, A.P.; Ewen, P.J.S., Photo–induced structural and physico–chemical changes in amorphous chalcogenide semiconductors, Phil. Mag. B 52 (1985) 347–362.

Owen, A.E., Le Comber, P.G.; Hajto, J.; Rose, M.J.; Snell, A.J., Switching in amorphous devices, Int. J. Electronics 73 (1992) 897–906.

Pearson, A.D.; Miller, C.E., Filamentary conduction in semiconducting glass diodes, App. Phys. Lett. 14 (1969) 280–282.

Pinto, R.; Ramanathan, K.V., Electric field induced memory switching in thin films of the chalcogenide system Ge—As—Se, Appl. Phys. Lett. 19 (1971) 221–223.

Popescu, C., The effect of local non–uniformities on thermal switching and high field behavior of structures with chalcogenide glasses, Solid–state electronics 18 (1975) 671–681.

Popescu, C.; Croitoru, N., The contribution of the lateral thermal instability to the switching phenomenon, J. Non–Cryst. Solids 8–10 (1972) 531–537.

Popov, A.I.; Geller, I.KH.; Shemetova, V.K., Memory and threshold switching effects in amorphous selenium, Phys. Stat. Sol. (a) 44 (1977) K71–K73.

Prakash, S.; Asokan, S.; Ghare, D.B., Easily reversible memory switching in Ge—As—Te glasses, J. Phys. D: Appl. Phys. 29 (1996) 2004–2008.

Rahman, S.; Sivarama Sastry, G., Electronic switching in Ge—Bi—Se—Te glasses, Mat. Sci. and Eng. B12 (1992) 219–222.

Ramesh, K.; Asokan, S.; Sangunni, K.S.; Gopal, E.S.R., Electrical Switching in germanium telluride glasses doped with Cu and Ag, Appl. Phys. A 69 (1999) 421–425.

Rose, M.J.;Hajto,J.;Lecomber,P.G.;Gage,S.M.;Choi,W.K.;Snell,A.J.;Owen,A.E., Amorphous silicon analogue memory devices, J. Non–Cryst. Solids 115 (1989) 168–170.

Rose,M.J.;Snell,A.J.;Lecomber,P.G.;Hajto,J.;Fitzgerald, A.G.;Owen,A.E., Aspects of non–volatility in a–Si:H memory devices, Mat. Res. Soc. Symp. Proc. V 258, 1992, 1075–1080.

Schuocker, D.; Rieder, G., On the reliability of amorphous chalcogenide switching devices, J. Non–Cryst. Solids 29 (1978) 397–407.

Sharma, A.K.; Singh, B., Electrical conductivity measurements of evaporated selenium films in vacuum, Proc. Indian Natn. Sci. Acad. 46, A, (1980) 362–368.

Sharma, P., Structural, electrical and optical properties of silver selenide films, Ind. J. Of pure and applied phys. 35 (1997) 424–427.

Snell, A.J.; Lecomber, P.G.; Hajto, J.; Rose, M.J.; Owen, A.E.; Osborne, I.L., Analogue memory effects in metal/ a–Si:H/metal memory devices. J. Non–Cryst. Solids 137–138 (1991) 1257–1262.

Snell, A.J.; Hajto, J.;Rose, M.J.; Osborne, L.S.; Holmes, A; Owen, A.E.; Gibson, R.A.G., Analogue memory effects in metal/a–Si:H/metal thin film structures, Mat. Res. Soc. Symp. Proc. V 297, 1993, 1017–1021.

Steventon,A.G., Microfilaments in amorphous chalcogenide memory devices, J. Phys. D: Appl. Phys. 8 (1975) L120–L122.

Steventon, A.G., The switching mechanisms in amorphous chalcogenide memory devices, J. Non–Cryst. Solids 21 (1976) 319–329.

Stocker, H.J., Bulk and thin film switching and memory effects in semiconducting chalcogenide glasses, App. Phys. Lett. 15 (1969) 55–57.

Tanaka, K., Ionic and mixed conductions in Ag photodoping process, Mod. Phys. Lett B 4 (1990) 1373–1377.

Tanaka, K.; Iizima, S.; Sugi, M.; Okada, Y.; Kikuchi, M., Thermal effects on switching phenomenon in chalcogenide amorphous semiconductors, Solid State Comm. 8 (1970) 387–389.

Thornburg, D.D., Memory switching in a Type I amorphous chalcogenide, J. Elect. Mat 2 (1973) 3–15.

Thornburg, D.D., Memory switching in amorphous arsenic triselenide, J. Non–Cryst. Solids 11 (1972) 113–120.

Thornburg, D.D.; White, R.M., Electric field enhanced phase separation and memory switching in amorphous arsenic triselenide, Journal(??) (1972) 4609–4612.

Tichy, L.; Ticha, H., Remark on the glass–forming ability in GexSe1–x and AsxSe1–x systems, J. Non–Cryst. Solids 261 (2000) 277–281.

Titus, S.S.K.; Chatterjee, R.; Asokan, S., Electrical switching and short–range order in As—Te—glasses. Phys. Rev. B 48 (1993) 14650–14652.

Tranchant,S.;Peytavin,S.;Ribes,M.;Flank,A.M.;Dexpert, H.;Lagarde,J.P., Silver chalcogenide glasses Ag—Ge—Se: Ionic conduction and exafs structural investigation, Transport–structure relations in fast ion and mixed conductors Proceedings of the 6th Riso International symposium. Sep. 9–13, 1985.

Tregouet, Y.; Bernede, J.C., Silver movements in Ag2Te thin films: switching and memory effects, Thin Solid Films 57 (1979) 49–54.

Uemura, O.; Kameda, Y.; Kokai, S.; Satow, T., Thermally induced crystallization of amorphous Ge0.4Se0.6, J. Non–Cryst. Solids 117–118 (1990) 219–221.

Uttecht, R.; Stevenson, H.; Sie, C.H.; Griener, J.D., Raghavan, K.S., Electric field induced filament formation in As—T3—Ge glass, J. Non–Cryst. Solids 2 (1970) 358–370.

Viger, C.; Lefrancois, G.; Fleury, G., Anomalous behaviour of amorphous selenium films, J. Non–Cryst. Solids 33 (1976) 267–272.

Vodenicharov, C.; Paranov,S.; Petkov,P., Electrode–limited currents in the thin–film M—GeSe—M system, Mat. Chem. And Phys. 21 (1989) 447–454.

Wang, S.–J.; Misium, G.R.; Camp, J.C.; Chen, K.–L.; Tigelaar, H.L., High–performance Metal/silicide antifuse, IEEE electron dev. Lett. 13 (1992)471–472.

Weirauch, D.F., Threshold switching and thermal filaments in amorphous semiconductors, App. Phys. Lett. 16 (1970) 72–73.

West, W.C.; Sieradzki, K.; Kardynal, B.; Kozicki, M.N., Equivalent circuit modeling of the Ag|As0.24S0.36Ag0.40|Ag System prepared by photodissolution of Ag, J. Electrochem. Soc. 145 (1998) 2971–2974.

West, W.C., Electrically erasable non–volatile memory via electrochemical deposition of multifractal aggregates, Ph.D. Dissertation, ASU 1998.

Zhang, M.; Mancini, S.; Bresser, W.; Boolchand, P., Variation of glass transition temperature, Tg, with average coordination number, <m>, in network glasses: evidence of a threshold behavior in the slope |dTg/d<m>| at the rigidity percolation threshold (<m>=2.4), J. Non–Cryst. Solids 151 (1992) 149–154.

Kolobov et al. "Photodoping of amorphous chalcogenides by metals," *Advances in Physics,* vol. 40 No. 5, Sep./Oct. 1991, pp. 625–684.

Fitzgerald et al., "Electron Spectroscopy and Diffraction Studies of Metal Contact Reactions in Amorphous Chalcogenides," *Surface Science,* vol. 162 (1985), pp. 568–578.

Goldschmidt et al., "The Kinetics of Photodissolution of Ag in Amorphous As2S3 Films," *Journal of Non–Crystalline Solids,* vol. 22, No. 2 Nov./Dec. 1976, pp. 229–243.

Axon Technologies Corporation, Technology Description: *Programmable Metalization Cell(PMC),* pp. 1–6 (Pre–May 2000).

Helbert et al., *Intralevel hybrid resist process with submicron capability,* SPIE vol. 333 Submicron Lithography, pp. 24–29 (1982).

Hilt, Dissertation: *Materials characterization of Silver Chalcogenide Programmable Metalization Cells,* Arizona State University, pp. Title page–114 (UMI Company, May 1999).

Hirose et al., *High Speed Memory Behavior and Reliability of an Amorphous As$_2$S$_3$ Film Doped Ag,* Phys. Stat. Sol. (a) 61, pp. 87–90 (1980).

Holmquist et al., *Reaction and Diffusion in Silver–Arsenic Chalcogenide Glass Systems,* 62 J. Amer.Ceram. Soc., No. 3–4, pp. 183–185 (Mar. –Apr. 1979).

Huggett et al., *Development of silver sensitized germanium selenide photoresist by reactive* sputter etching in SF$_5$, 42 Appl. Phys. Lett., No. 7, pp. 592–594 (Apr. 1983).

Kawaguchi et al., *Mechanism of photosurface deposition,* 164–166 J. Non–Cryst, Solids, pp. 1231–1234 (1993).

Kolobov and Elliott, Photodoping of Amorphous Chalcogenides by Metals, Advances in Physics, vol. 40, No. 5, 625–664 (1991).

Kozicki, et al., "Applications of Programmable Resistance Changes in Metal–doped Chalcogenides", Proceedings of the 1999 Symposium on Solid State Ionic Devices, Editors –E.D. Wachsman et al., The Electrochemical Society, Inc., 1– 12 (1999).

Kozicki, et al., *Nanoscale effects in devices based on chalcogenide solid solutions*. Superlattices and Microstructures, 27, 485–488 (2000).

Kozicki, et al., *Nanoscale phase separation in Ag–Ge–Se glasses*, Microelectronic Engineering. vo. 63/1–3, 155–159 (2002).

M.N. Kozicki and M. Mlikova, *Silver incorporation in thin films of selenium rich Ge–Se glasses*, Proceedings of the XIX International Congress on Glass, Society for Glass Technology, 226–227 (2001).

McHardy et al., *The dissolution of metals in amorphous chalcogenides and the effects o electron and ultraviolet radiation*, 20 J. Phys. C.: Solid State Phys., pp. 4055–4075 (1987).

Owen et al., *Metal–Chalcogenide Photoresists for High Resolution Lithography and Sub–Micron Structures*, Nanostructure Physics and Fabrication, pp. 447–451 (M. Reed ed. 1989).

Shimizu et al., *The Photo–Erasable Memory Switching Effect of Ag Photo–Doped Chalcogenide Glasses*, 46 B. Chem Soc. Japan, No. 12, pp. 3662–3665 (1973).

"Modification of Vitreous As2Se3" Solar Energy Materials, Kolomiets, et al., vol.8 No. 1–3, Nov. 1982; pp. 1 –8.

"Diffusion of Metal Ions and Stimulated Currents into As2Se3 Thin Films", Kim et al., Japanese Journal of Applled Physics, Part 1, vol. 28, No. 6, Jun. 1989, pp. 965–971.

* cited by examiner

INTEGRATED CIRCUIT DEVICE AND FABRICATION USING METAL-DOPED CHALCOGENIDE MATERIALS

This application is a divisional of application Ser. No. 09/943,426, filed Aug. 30, 2001, the subject matter of which is incorporated by reference herein.

TECHNICAL FIELD OF THE INVENTION

The present invention relates generally to integrated circuit memory devices, and in particular to the metal doping of chalcogenide materials in the fabrication of chalcogenide memory elements and integrated circuit devices containing such memory elements.

BACKGROUND OF THE INVENTION

Electrically programmable and erasable materials, i.e., materials that can be electrically switched between a generally resistive state and a generally conductive state are well known in the art. Chalcogenide materials are one class of examples of such materials finding use in the semiconductor industry, particularly in the fabrication of non-volatile memory devices.

Chalcogenide materials are compounds made of one or more chalcogens and one or more elements that are more electropositive than the chalcogens. Chalcogens are the Group VIB elements of the traditional IUPAC version of the periodic table, i.e., oxygen (O), sulfur (S), selenium (Se), tellurium (Te) and polonium (Po). The more electropositive elements are generally selected from Groups IVB and VB. Typical combinations for non-volatile memory devices include selenium and/or tellurium with germanium (Ge) and/or antimony (Sb). However, other combinations are also known, such as combinations of arsenic (As) and sulfur.

To obtain the desired electrical characteristics, chalcogenide materials are often doped with metal, such as copper (Cu), silver (Ag), gold (Au) or aluminum (Al). FIGS. 1A–1D depict the fabrication of a simple chalcogenide memory element 100. The basic structure of a chalcogenide memory element includes a first electrode, a second electrode and a chalcogenide material interposed between the first and second electrodes. Additional detail of chalcogenide memory devices, as well as examples of variations on the basic structure of a chalcogenide memory element, are given in U.S. Pat. No. 5,998,244 issued Dec. 7, 1999 to Wolstenholme et al., U.S. Pat. No. 5,920,788 issued Jul. 6, 1999 to Reinberg, and U.S. Pat. No. 5,837,564 issued Nov. 17, 1998 to Sandhu et al., each of which is commonly assigned with the assignee of the present disclosure. In general, chalcogenide memory elements are formed on a semiconductor wafer or other substrate as a portion of an integrated circuit device.

Chalcogenide memory elements typically store a single bit, e.g., a low resistivity (high conductivity) corresponding to a first logic state and a high resistivity (low conductivity) corresponding to a second logic state. Differing levels of resistivity of the chalcogenide memory elements are sensed using current sensing techniques well known in the art while applying a read potential of less than the threshold potential.

Chalcogenide memory elements can be electrically switched between conductivity states by applying varying electrical fields to the doped chalcogenide material. By applying a programming potential above some threshold potential, the metal dopant atoms are believed to align in a dendritic structure, thereby forming conductive channels and decreasing the resistivity of the chalcogenide material. This transition is reversible by applying a potential having an opposite polarity. A range of applied potentials having a magnitude of less than the threshold potential, i.e., read potentials, can be applied without altering the resistivity of the doped chalcogenide materials. These read potentials can be applied to the chalcogenide memory elements for sensing the resistivity of the doped chalcogenide material and, thus, the memory elements' data values.

Unlike dynamic random access memory (DRAM) devices, a non-volatile memory device does not require a periodic refresh to maintain its programmed state. Instead, non-volatile memory devices can be disconnected from a power source for extended periods of time, often measured in years, without the loss of the information stored in its memory cells. Chalcogenide materials best suited for use in non-volatile memory devices will thus tend to maintain their degree of resistivity indefinitely if an applied voltage does not exceed the threshold potential.

In FIG. 1A, a first electrode 110 is formed and a chalcogenide layer 115 is formed overlying the first electrode 110. As noted previously, electrical characteristics of chalcogenide layer 115 may be improved through doping of the chalcogenide material with metal. This is typically carried out through a process known as photo-doping where diffusion of metal atoms is photon induced. In this process, a metal layer 120 is first formed on the chalcogenide layer 115 as shown in FIG. 1A. The metal layer 120 typically contains the copper, silver, gold, aluminum or other high-diffusing metal. Formation of the first electrode 110 and/or the metal layer 120 is typically performed in a vacuum chamber, e.g., using a vacuum sputtering process.

To continue the photo-doping process in FIG. 1B, electromagnetic radiation 125 is directed at the metal layer 120, resulting in diffusion of metal atoms from the metal layer 120 into the chalcogenide layer 115. The electromagnetic radiation 125 is generally ultraviolet (UV) light. Driving metal atoms into the chalcogenide layer 115 results in a doped chalcogenide layer 130 containing the chalcogenide material and the diffused metal. The semiconductor wafer must generally be removed from the vacuum chamber to expose the wafer surface to the UV light source.

The photo-doping process is generally carried out until the metal layer 120 is completely diffused into the doped chalcogenide layer 130 as shown in FIG. 1C. The thickness of the metal layer 120 should be chosen such that the desired doping level can be attained in the doped chalcogenide layer 130. However, the metal layer 120 must be thin enough, e.g., hundreds of angstroms, to allow transmission of the electromagnetic radiation 125 in order to produce the desired photon-induced diffusion of metal. As shown in FIG. 1D, a second electrode 150 is then formed overlying the doped chalcogenide layer 130 and any remaining portion of the metal layer 120 to produce chalcogenide memory element 100. As with the first electrode 110 and/or the chalcogenide layer 115, formation of the second electrode 150 is also typically performed in a vacuum chamber. The second electrode 150 is preferably a material having a different work function ($\Phi_m$) than the first electrode 110. The work function is a measure of the energy required to remove an electron from a material's surface.

There are several disadvantages to the traditional photo-doping process. The process can be time consuming as the semiconductor wafers are moved in and out of a vacuum chamber during the various processing stages described above. This movement of the semiconductor wafers among various process equipment also increases the chance of contamination or other damage during transport. Also, because the metal layer must be thin for efficient photon-induced diffusion of metal, the desired doping level may not be efficiently attainable with a single photo-doping process as the necessary thickness of the metal layer may result in excessive reflection of the electromagnetic radiation.

For the reasons stated above, and for other reasons stated below that will become apparent to those skilled in the art upon reading and understanding the present specification, there is a need in the art for alternative methods for producing chalcogenide memory elements.

SUMMARY

Methods are described herein for forming metal-doped chalcogenide layers and devices containing such doped chalcogenide layers. The methods include using a plasma to induce diffusion of metal into a chalcogenide layer concurrently with metal deposition. The plasma contains at least one noble gas of low atomic weight, such as neon or helium. The plasma has a sputter yield sufficient to sputter a metal target and a UV component of its emitted spectrum sufficient to induce diffusion of the sputtered metal into the chalcogenide layer. Using such methods, a conductive layer can be formed on the doped chalcogenide layer in situ. In integrated circuit devices, such as non-volatile chalcogenide memory devices, doping of a chalcogenide layer concurrently with metal deposition and formation of a conductive layer in situ with the doping of the chalcogenide layer reduces contamination concerns and physical damage resulting from moving the device substrate from tool to tool, thus facilitating improved device reliability.

For another embodiment, the invention provides a method of forming a doped chalcogenide layer. The method includes sputtering metal using a plasma containing at least one component gas selected from the group consisting of neon and helium and driving the sputtered metal into a layer of chalcogenide material using the UV component generated by the plasma.

For a further embodiment, the invention provides a method of forming a doped chalcogenide layer. The method includes forming a layer of chalcogenide material and sputtering metal onto the layer of chalcogenide material using a plasma containing at least two noble gases. The plasma emits a spectrum having a UV component capable of driving the sputtered metal into the layer of chalcogenide material through UV-enhanced diffusion. For one embodiment, the composition of the plasma is chosen to have an average atomic weight sufficient to produce a desired sputtering efficiency. For another embodiment, the composition of the plasma is chosen to have a desired relative intensity of a UV component of the emitted spectrum of the plasma. For yet another embodiment, the composition of the plasma is chosen to have a desired emitted spectrum of the plasma.

For one embodiment, the invention provides a method of forming a chalcogenide memory element having a first electrode, a second electrode, and a doped chalcogenide layer interposed between the first electrode and the second electrode. The method includes forming a chalcogenide layer on the first electrode, sputtering metal onto the chalcogenide layer and diffusing metal into the chalcogenide layer using a first plasma containing at least one component gas selected from the group consisting of neon and helium, thereby forming the doped chalcogenide layer, and sputtering metal onto the chalcogenide layer using a second plasma containing at least one component gas having an atomic weight higher than an atomic weight of neon, thereby forming the second electrode. For a further embodiment, the first plasma and the second plasma are the same plasma. For a still further embodiment, the composition of the first plasma is modified to generate the second plasma. Such modification of the composition may occur as a step change between sputtering stages or it may occur concurrently with sputtering of the metal.

For another embodiment, the invention provides a method of forming a chalcogenide memory element having a first electrode, a second electrode, and a doped chalcogenide layer interposed between the first electrode and the second electrode. The method includes forming a chalcogenide layer on the first electrode, sputtering silver onto the chalcogenide layer and diffusing silver into the chalcogenide layer using a first plasma generated from feed gas consisting essentially of neon, thereby forming the doped chalcogenide layer, and sputtering silver onto the doped chalcogenide layer using a second plasma generated from feed gas consisting essentially of argon, thereby forming the second electrode.

For yet another embodiment, the invention provides a method of forming a non-volatile memory device. The method includes forming word lines and forming first electrodes coupled to the word lines, wherein each word line is coupled to more than one first electrode. The method further includes forming a chalcogenide layer on each first electrode and sputtering metal onto each chalcogenide layer and diffusing metal into each chalcogenide layer using a first plasma containing at least one component gas selected from the group consisting of neon and helium, thereby forming doped chalcogenide layers. The method still further includes sputtering metal onto each doped chalcogenide layer using a second, different, plasma, thereby forming second electrodes. The second plasma may contain at least one component gas having an atomic weight higher than the atomic weight of neon. Alternatively or additionally, the second plasma may contain nitrogen ($N_2$) such that the second electrode is formed of a metal-nitride material. The method still further includes forming bit lines coupled to the second electrodes, wherein each bit line is coupled to more than one second electrode. Each diode may be formed interposed between a second electrode and a bit line, such that each second electrode is coupled to a bit line through a diode. Alternatively, each diode may be formed interposed between a first electrode and a word line, such that each first electrode is coupled to a word line through a diode.

Further embodiments of the invention include methods of varying scope.

DETAILED DESCRIPTION

In the following detailed description of the present embodiments, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that process, electrical or mechanical changes may be made without departing from the scope of the present invention. The terms wafer or substrate used in the following description include any base semiconductor structure. Examples include silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and the terms wafer and substrate include the underlying layers containing such regions/junctions. The following detailed description is, therefore, not to be taken in a limiting sense, and the scope of the present invention is defined only by the appended claims and equivalents thereof.

FIGS. 2A–2D depict fabrication of a chalcogenide memory element 200 as a portion of an integrated circuit device in accordance with one embodiment of the invention. FIGS. 2A–2D are cross-sectional views taken during various processing stages.

Figure 1A:
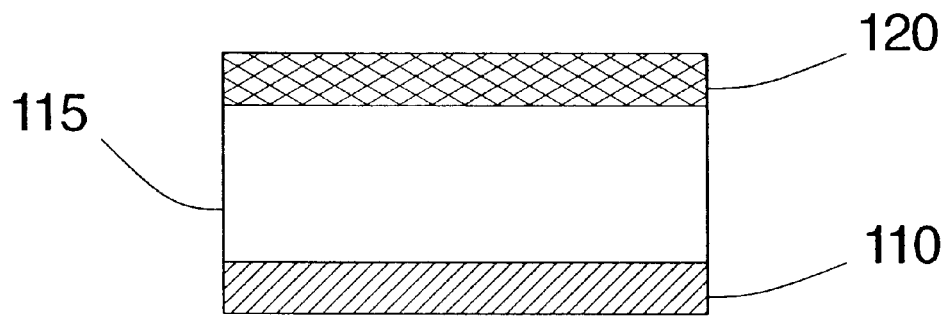
FIGS. 1A–1D are cross-sectional views of a chalcogenide memory element during various processing stages.
Figure 1B:
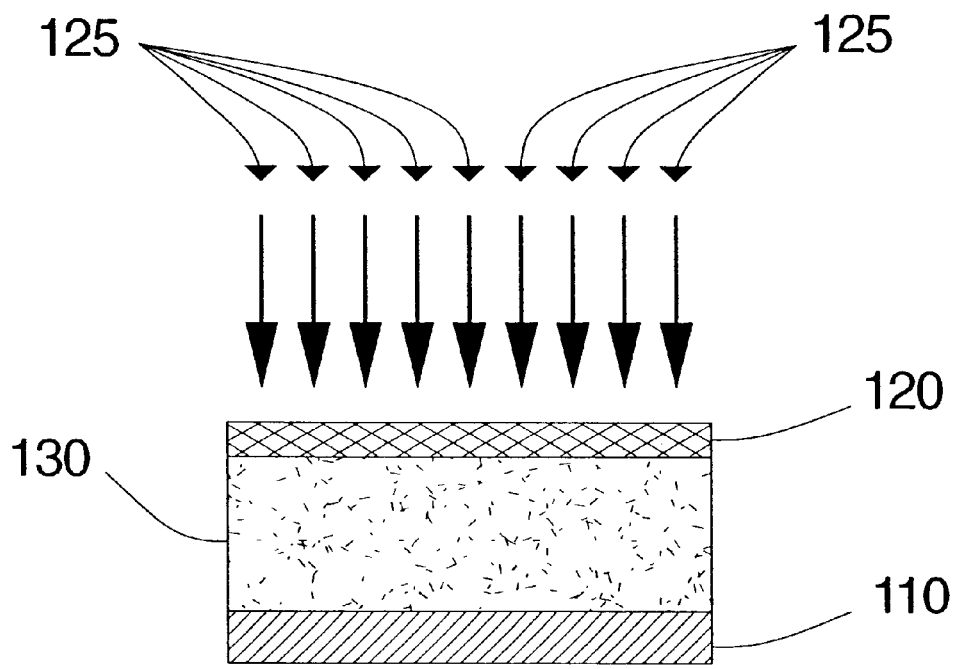
Figure 1C:
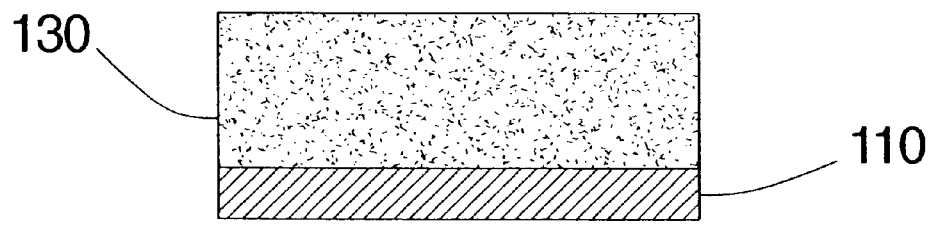
Figure 1D:
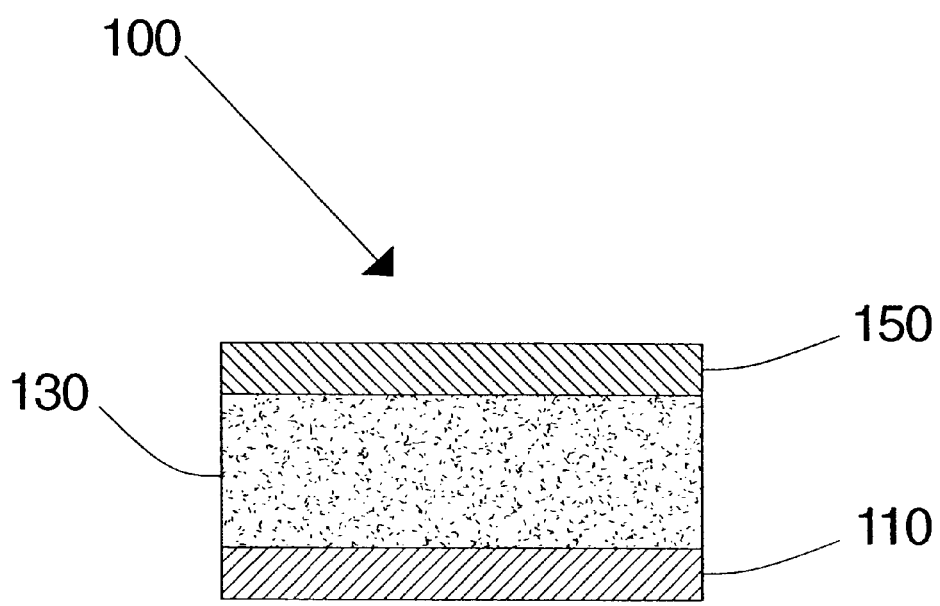
Figure 2A:
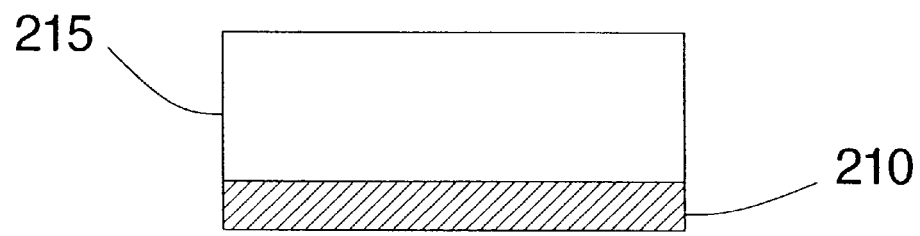
FIGS. 2A–2D are cross-sectional views of a chalcogenide memory element during various processing stages in accordance with an embodiment of the invention.

In FIG. 2A, a lower or first electrode 210 is formed on a substrate (not shown). The first electrode 210 contains conductive material. Examples include conductively doped polysilicon, carbon (C), metals, metal alloys, metal silicides, conductive metal nitrides and conductive metal oxides. The first electrode 210 may further contain more than one conductive material. For example, the first electrode 210 may contain a layer of carbon overlying a layer of molybdenum (Mo) or a layer of tungsten (W) overlying a layer of titanium nitride (TiN). In addition, the first electrode 210 may include one or more adhesion or barrier layers adjacent underlying or overlying layers. Any adhesion or barrier layer should preferably be conductive as to not interfere with programming of the chalcogenide memory element 200. For one embodiment, the first electrode 210 contains silver. For a further embodiment, the first electrode 210 is a layer of silver.

The first electrode 210 is preferably formed using a physical vapor deposition (PVD) process. Examples include vacuum or thermal evaporation, electron-beam evaporation and sputtering techniques well known in the art. In a PVD process, a source or target containing the material to be deposited is evaporated and may include ionization of some or all of the vaporized target material. The vaporized and/or ionized species impinging on the substrate can then deposit on the substrate. PVD processes are preferred for their general ability to form layers of high purity, limited only by the purity of the source or target used in the PVD process. However, other deposition techniques may be used, such as a chemical vapor deposition (CVD) process in which vaporized chemical precursors are adsorbed on the substrate surface and reacted to form the first electrode 210.

For one embodiment, the first electrode 210 has a thickness of approximately 500–1000 Å. For a further embodiment, the first electrode 210 has a thickness of approximately 700 Å.

Following formation of the first electrode 210, a chalcogenide layer 215 is formed on the first electrode 210. As with the first electrode 210, the chalcogenide layer 215 is preferably formed using a PVD process, but may be formed using other deposition techniques. For one embodiment, the chalcogenide layer 215 contains a chalcogenide material containing one or more Group VIB elements of the traditional IUPAC version of the periodic table, i.e., oxygen (O), sulfur (S), selenium (Se), tellurium (Te) and polonium (Po), and one or more Groups IVB and VB elements of the traditional IUPAC version of the periodic table, i.e., carbon (C), silicon (Si), germanium (Ge), tin (Sn), lead (Pb), nitrogen (N), phosphorus (P), arsenic (As), antimony (Sb) and bismuth (Bi). More preferably, the chalcogenide layer 215 contains a chalcogenide material containing a combination of selenium and/or tellurium with germanium and/or antimony. For one embodiment, the chalcogenide layer 215 contains a germanium selenide material (GeSe or GeSe$_2$).

For one embodiment, the chalcogenide layer 215 has a thickness of approximately 300–700 Å. For a further embodiment, the chalcogenide layer 215 has a thickness of approximately 500 Å.

Figure 2B:
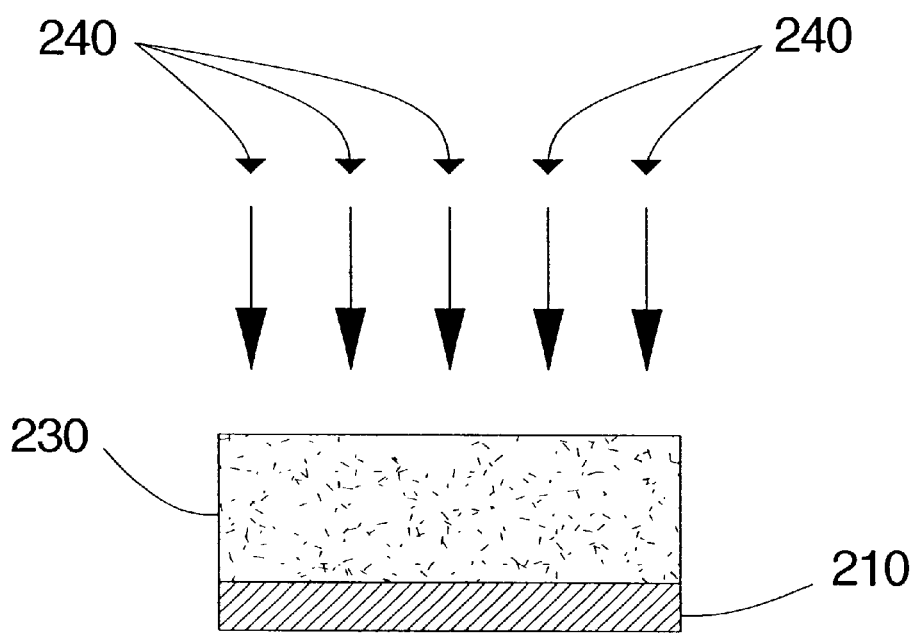

As shown in FIG. 2B, the chalcogenide layer 215 is doped with metal 240 using a sputtering process to produce a doped chalcogenide layer 230. The doped chalcogenide layer 230 is doped to a desired doping level. For one embodiment, the desired doping level produces a doped chalcogenide layer 230 saturated with the metal 240. For another embodiment, the desired doping level produces an oversaturated doped chalcogenide layer 230. For yet another embodiment, the desired doping level is approximately 15–30 wt % of the metal 240 in the doped chalcogenide layer 230.

One example of an apparatus for performing sputtering may include an ENDURA® system commercially available from Applied Materials, Santa Clara, Calif., USA. The plasma generated in such equipment will emit a UV component, thus providing photon-induced diffusion during the sputtering process.

Figure 3:
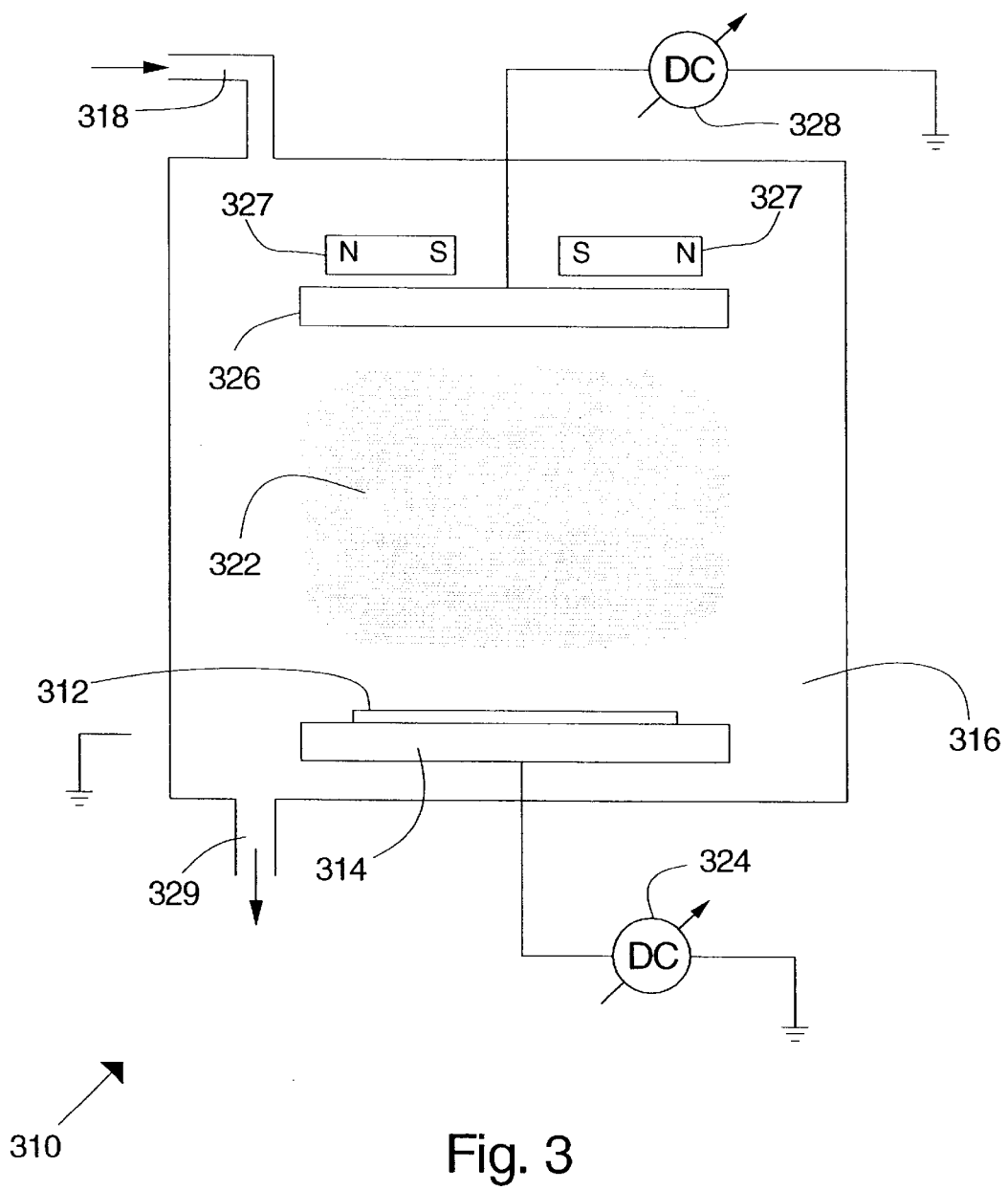
FIG. 3 is a schematic illustration of one physical vapor deposition apparatus suitable for use with the embodiments of the invention.

FIG. 3 is a schematic illustration of one PVD apparatus 310 suitable for use with the embodiments of the invention. Those familiar with PVD apparatus will recognize that it is a simplified schematic and that typical PVD apparatus may contain additional or alternate components.

A conductive pedestal 314 containing substrate 312 is located in a deposition chamber 316. The pedestal 314 is connected to a DC power source 324. A gas inlet 318 is provided for introduction of component gases into the chamber 316. The component gases make up the plasma 322. The component gases are generally fed to the deposition chamber 316 continuously during the operation of the apparatus 310. As used herein, component gases do not include any vaporized target material created during the sputter process.

A sputter target 326 connected to a DC power source 328 is located in the chamber 316. The target 326 may be a plate formed of the material to be sputtered. Examples of materials to be sputtered in the doping of the chalcogenide layer 215 include high-diffusion metals such as copper, silver, gold and aluminum. Excess or spent gases are drawn from the deposition chamber 316 through a vent 329 by a vacuum pump (not shown).

In the magnetron configuration, magnets 327 aid in the development of the plasma 322. The plasma 322 is formed by the application of a bias across the target 326 as a cathode and the substrate 312 as an anode. Magnets 327 are often placed behind the target 326.

In order to increase the UV component emitted by the plasma, low molecular weight noble gases are added to the plasma. In particular, the plasma is formed at least in part using neon (Ne) and/or helium (He). The plasma may further contain other component gases. One example is argon (Ar), which is commonly used in sputtering processes. While argon's spectrum has a UV component as well, its relative intensity is relatively low compared to that of neon or helium, thus resulting in lower rates of metal diffusion. For one embodiment, the plasma used during the doping process is generated from feed gas consisting essentially of neon. For another embodiment, the plasma used during the doping process contains helium. For yet another embodiment, the plasma used during the doping process contains at least argon and neon. The plasma could also be generated from feed gas consisting essentially of helium for its increased UV component, but such use can lead to undesirable reductions in sputtering efficiency. Use of lower atomic weight gases can result in much higher operating pressures than traditional PVD processes, e.g., 30–300 mTorr.

By adjusting the volume percentages of the gases used in generating the plasma, a plasma can be generated having an average atomic weight anywhere between the lowest atomic weight of the gases and the highest atomic weight of the gases. In this manner, a plasma can be created having an average atomic weight sufficient to facilitate a desired sputtering efficiency. Sputtering efficiency generally refers to the number of target atoms ejected per incident ion, typically in the range of about 0.5–1.5. Sputtering efficiency largely determines the rate of sputter implantation or deposition. Sputtering efficiency depends on a number of factors, including the direction of incident ions, target material, mass of bombarding ions, the energy of the bombarding ions, dose, crystal state and surface binding energy.

It is noted that where more than two gases make up the plasma, multiple combinations of these gases can produce the same average atomic weight. For example, a mixture of 5% argon, 78% neon and 17% helium by volume will have approximately the same average atomic weight as a mixture of 10% argon, 67% neon and 23% helium by volume.

By adjusting the volume percentages of the gases in the plasma, a plasma also can be generated having a UV component that is a composite of the spectra of the individual gases and having a relative intensity generally between that of the lowest relative intensity of the gases in the plasma and that of the highest relative intensity of the gases in the plasma. In this manner, a plasma can be created having a relative intensity of its composite UV component sufficient to produce a desired level of photon-induced diffusion of the sputtered metal. It is noted that where more than two gases make up the plasma, multiple combinations of these gases can emit UV components having the same relative intensity.

In view of the above, it is possible to choose a plasma having a desired relative intensity of its emitted UV component and a desired average atomic weight through the selection of two or more component gases and their relative volume percentages. However, it is recognized that these values, i.e., the desired relative intensity and the desired average atomic weight, may be mutually exclusive. In other words, attaining one value may require a compromise on the other. One method of compromise would be to determine the combinations of component gases producing a plasma having the desired relative intensity and then to choose one of these combinations of the component gases having an average atomic weight near the desired atomic weight. Another method would be to determine the combinations of component gases producing a plasma having the desired average atomic weight and then to choose one of these combinations of the component gases having a relative intensity of its UV component near the desired relative intensity.

The UV components of differing plasmas may have differing spectra, but the same relative intensity. Because the spectrum can also affect diffusion rates, it may be desirable to produce a specific emitted spectrum in a resulting plasma. Accordingly, for one embodiment, a mixture of component gases is chosen to produce a desired spectrum of the resulting plasma. For a further embodiment, a mixture of component gases is chosen to produce a desired spectrum of the resulting plasma having a higher level of visible components than a plasma consisting of neon. For another embodiment, a mixture of component gases capable of producing a desired spectrum in a resulting plasma is chosen to produce a target sputter efficiency. In general, the component gases of the plasma used in the sputtering process for doping of the chalcogenide layer 215 are selected to produce desired diffusion and sputtering rates.

As an example of how the plasma composition affects diffusion, an experiment was undertaken to sputter silver onto germanium selenide using different plasmas, but otherwise comparable processing conditions. Using a plasma generated from feed gas consisting essentially of neon, approximately 501.6 Å of silver were sputtered onto approximately 503 Å of germanium selenide (GeSe). It is presumed that approximately 300 Å of the silver diffused into the germanium selenide layer. In contrast, using a plasma generated from feed gas consisting essentially of argon, and sputtering approximately 468.0 Å of silver onto approximately 503 Å of germanium selenide (GeSe), approximately 336.3 Å of silver were detected on the surface of the germanium selenide. Thus, for argon, it is presumed that only approximately 131.7 Å of the silver diffused into the germanium selenide layer.

Returning to FIG. 2C, a top or second electrode 250 is formed on the doped chalcogenide layer 230. The second electrode 250 generally follows the same guidelines as the first electrode 210. Accordingly, the second electrode 250 contains conductive material. Examples include conductively doped polysilicon, carbon, metals (including refractory metals), metal alloys, metal silicides, conductive metal nitrides and conductive metal oxides. The second electrode 250 may further contain more than one conductive material. In addition, the second electrode 250 may include one or more adhesion or barrier layers adjacent underlying or overlying layers. Any adhesion or barrier layer should preferably be conductive as to not interfere with programming of the chalcogenide memory element 200. For one embodiment, the second electrode 250 contains silver. For a further embodiment, the second electrode 250 is a layer of silver.

The second electrode 250 is preferably formed using a PVD process, but may be formed by other methods such as CVD techniques. The second electrode 250 is more preferably formed using the same PVD apparatus and target as used during the doping of the chalcogenide layer 215. In this manner, the second electrode 250 may be formed in situ with the doping process, thus further reducing risks of contamination or damage associated with transport of the semiconductor substrate. Accordingly, for one embodiment, the second electrode 250 is formed by sputtering metal 245 onto the doped chalcogenide layer 230.

For one embodiment, the second electrode 250 has a thickness of approximately 800–1200 Å. For a further embodiment, the second electrode 250 has a thickness of approximately 1000 Å.

For one embodiment, the component gases used during doping of the chalcogenide layer 215 are evacuated from the deposition chamber 316 prior to formation of the second electrode 250. For such an embodiment, a new plasma 322 is formed with the new component gases for the deposition of the second electrode 250. For example, doping of the chalcogenide layer 215 can be performed using a plasma 322 generated using a feed gas consisting essentially of neon. The deposition chamber 316 is evacuated after the desired doping level is attained. Subsequently, formation of the second electrode can be performed using a plasma 322 generated using a feed gas consisting essentially of argon. Alternatively or additionally, the second plasma 322 may contain nitrogen or oxygen to form conductive metal nitrides or metal oxides, respectively.

Alternatively, the component gas feed composition could be changed without an evacuation of the deposition chamber 316. For example, doping of the chalcogenide layer 215 can be performed using a component gas and plasma 322 having a first composition, e.g., consisting essentially of neon. As the desired doping level is approached, the component gas feed could be changed to the second composition, e.g., consisting essentially of argon. For this example, the concentration of argon in the plasma 322 will thus gradually increase as argon is fed to the deposition chamber 316 and mixed gases are drawn off. As the composition of the plasma 322 changes, driving to a higher average atomic weight and/or a lower UV component, the dynamics would shift away from diffusion and toward deposition. To decrease the rate of change in the composition of the plasma 322, the component gas feed composition could be changed gradually instead of making a step change.

Figure 2C:
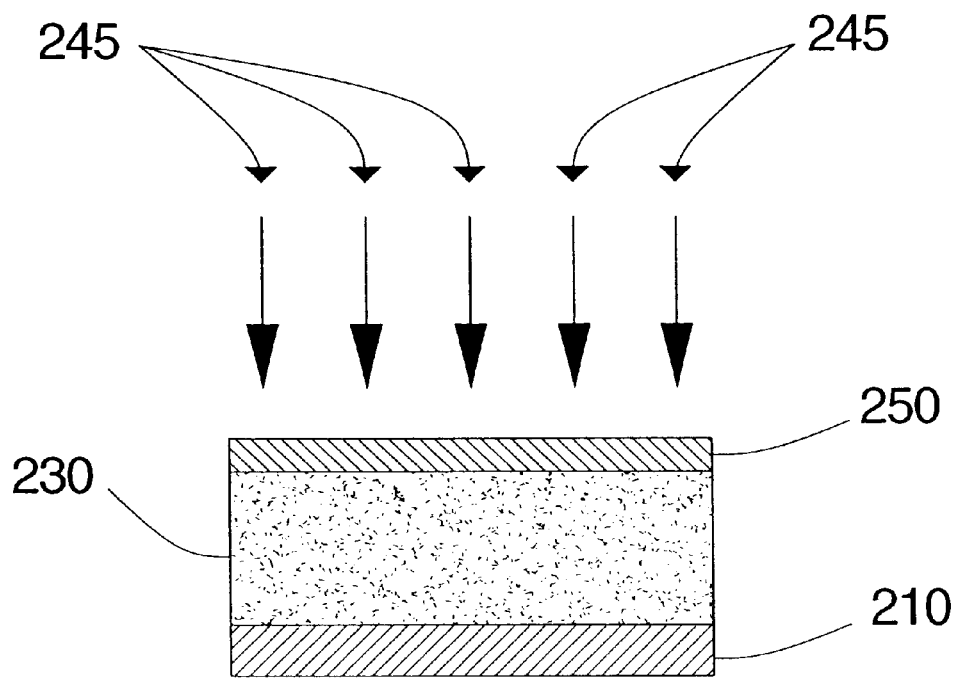

For another embodiment, the processing described with reference to FIGS. 2B and 2C could be combined using a single composition for plasma 322. For such an embodiment, the component gases are chosen such that a desired combination of diffusion and deposition occurs. The rate of diffusion should be high enough relative to the rate of deposition that sufficient doping occurs before the second electrode 250 becomes thick enough to block further diffusion of metal into the doped chalcogenide layer 230.

Figure 2D:
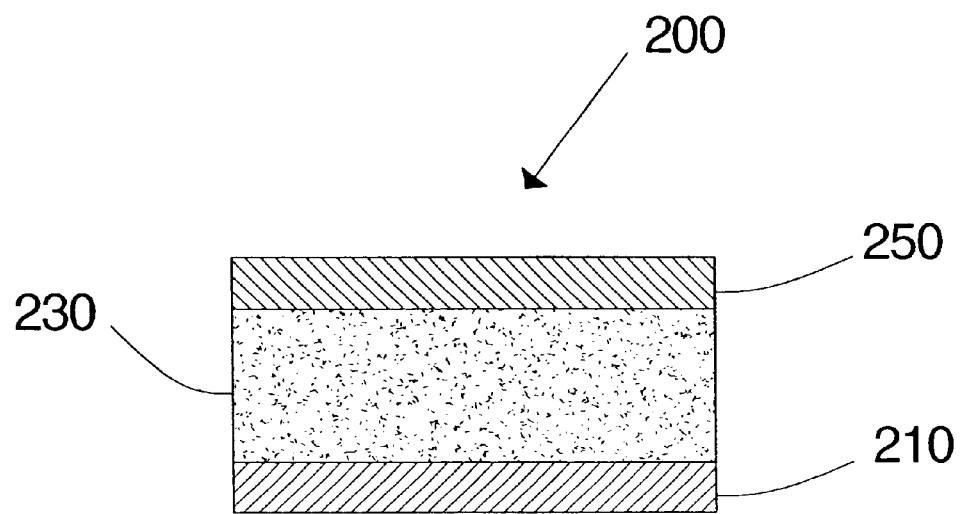

FIG. 2D shows the chalcogenide memory element 200 upon formation of the second electrode 250. The chalcogenide memory element 200 has a doped chalcogenide layer interposed between the first electrode 210 and the second electrode 250. The chalcogenide memory element 200 can be used to form a chalcogenide memory cell where the stale of the doped chalcogenide layer 230 is indicative of the data value stored by the memory cell.

Figure 4:
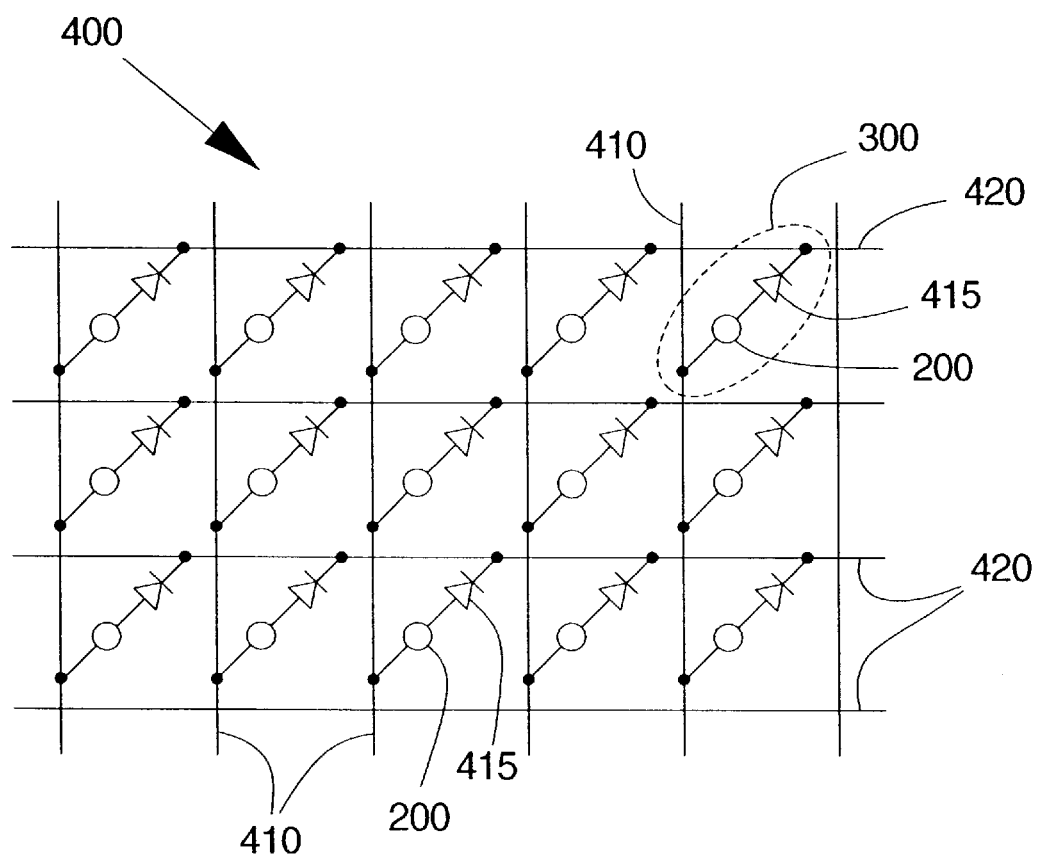
FIG. 4 is a schematic of a portion of a memory array in accordance with an embodiment of the invention.

FIG. 4 is a schematic showing a portion of a memory array 400 containing chalcogenide memory elements 200 as described herein. The memory array 400 includes a number of memory cells 405 arranged generally in rows and columns. Typical memory arrays 400 contain millions of these memory cells 405. Each memory cell 405 includes a chalcogenide memory element 200 coupled between a first conductive line, such as word line 410, and a diode 415. The diode 415 is further coupled between a second conductive line, such as bit line 420, and the chalcogenide memory element 200. Alternatively, the diode 415 could be coupled between the first conductive line and the chalcogenide memory element 200. The diode 415 serves as the access device to the memory cell 300. A grouping of memory cells 300 coupled to the same word line 410 are typically referred to as a row of memory cells. Likewise, a grouping of memory cells 300 coupled to the same bit line 420 are typically referred to as a column of memory cells.

Figure 5:
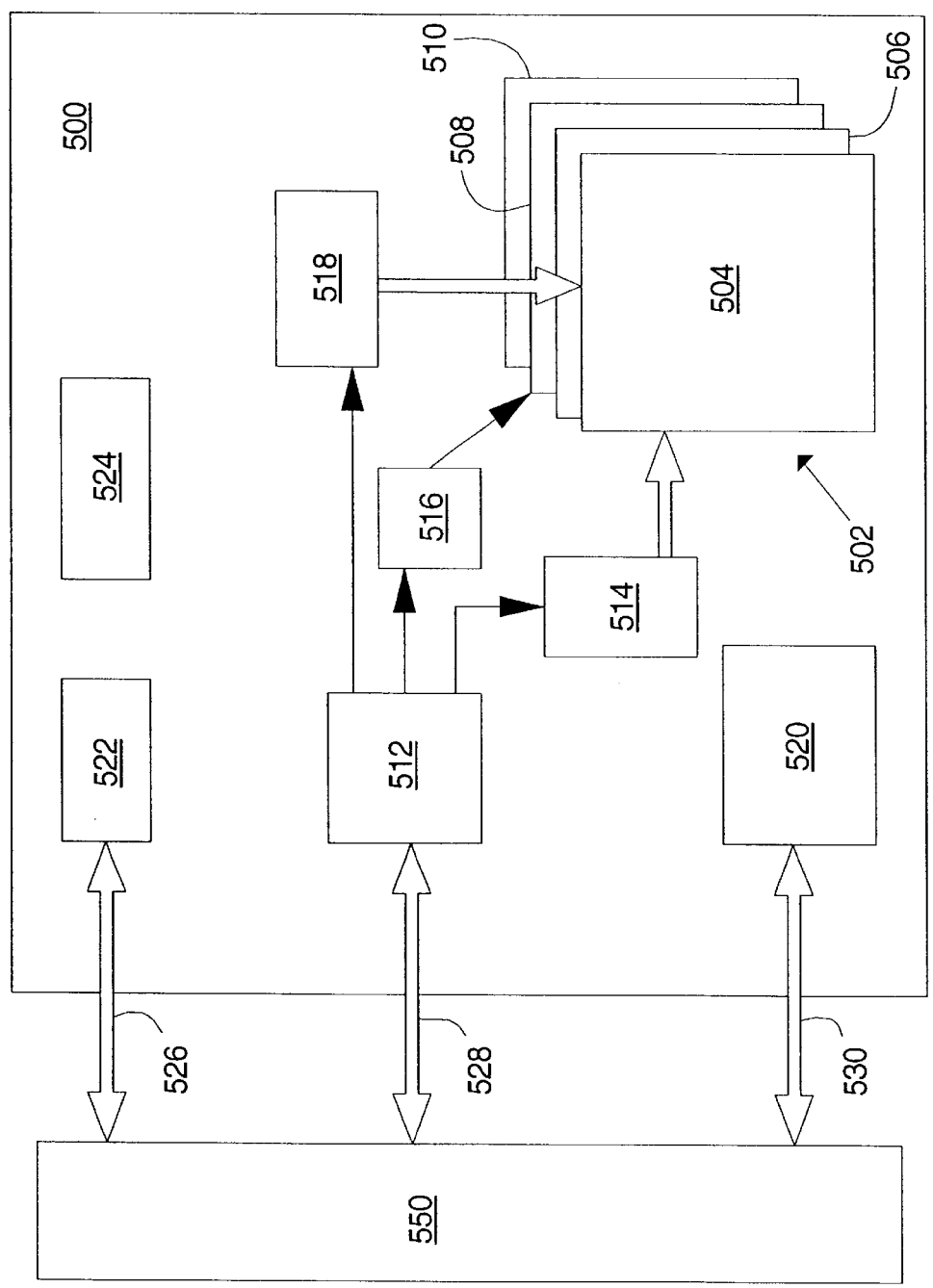
FIG. 5 is a simplified block diagram of an integrated circuit memory device in accordance with an embodiment of the invention.

FIG. 5 is a simplified block diagram of an integrated circuit memory device 500 in accordance with an embodiment of the invention. The memory device 500 is a non-volatile memory device containing chalcogenide memory elements in accordance with the invention. The memory device 500 includes an array of memory cells 502 including the non-volatile chalcogenide memory elements. The memory array 502 is arranged in a plurality of addressable banks. In one embodiment, the memory contains four memory banks 504, 506, 508 and 510. Each memory bank contains addressable rows and columns of memory cells.

The data stored in the memory array 502 can be accessed using externally provided location addresses received by address register 512 via address signal connections 528. The addresses are decoded using bank decode logic 516 to select a target memory bank. The addresses are also decoded using row decode circuitry 514 to select the target rows. The addresses are further decoded using column decode circuitry 518 to select one or more target columns.

Data is input and output through I/O circuit 520 via data connections 530. I/O circuit 528 includes data output registers, output drivers and output buffers. Command execution logic 522 is provided to control the basic operations of the memory device 500 in response to control signals received via control signal connections 526. A state machine 524 may also be provided to control specific operations performed on the memory array and cells. The command execution logic 522 and/or state machine 524 can be generally referred to as control circuitry to control read, write, erase and other memory operations. The data connections 530 are typically used for bi-directional data communication. The memory can be coupled to an external processor 550 for operation or testing.

It will be appreciated by those skilled in the art that additional circuitry and control signals can be provided, and that the memory device of FIG. 5 has been simplified to help focus on the invention. It will be understood that the above description of a memory device is intended to provide a general understanding of the memory and is not a complete description of all the elements and features of a typical memory device.

As recognized by those skilled in the art, memory devices of the type described herein are generally fabricated as an integrated circuit containing a variety of semiconductor devices. The integrated circuit is supported by a substrate. Integrated circuits are typically repeated multiple times on each substrate. The substrate is further processed to separate the integrated circuits into dies as is well known in the art.

The foregoing figures were used to aid the understanding of the accompanying text. However, the figures are not drawn to scale and relative sizing of individual features and layers are not necessarily indicative of the relative dimensions of such individual features or layers in application. Accordingly, the drawings are not to be used for dimensional characterization.

Although dimensional characteristics were provided herein for information purposes, it is recognized that there is a continuing drive to reduce integrated circuit device dimensions for increased performance and reduced fabrication costs. In addition, the concepts described herein are not fundamentally limited by absolute dimensions. Accordingly, improvements in fabrication and sensing technologies are expected to facilitate reduced dimensional characteristics of the chalcogenide memory elements described herein, particularly as they relate to layer thickness.

Conclusion

Methods have been described for forming metal-doped chalcogenide layers and devices containing such doped chalcogenide layers. The methods include using a plasma to induce diffusion of metal into a chalcogenide layer concurrently with metal deposition. The plasma contains at least one noble gas of low atomic weight, such as neon or helium. The plasma has a sputter yield sufficient to sputter a metal target and a UV component of its emitted spectrum sufficient to induce diffusion of the sputtered metal into the chalcogenide layer. Using such methods, a conductive layer can be formed on the doped chalcogenide layer in situ. In integrated circuit devices, such as non-volatile chalcogenide memory devices, doping of a chalcogenide layer concurrently with metal deposition and formation of a conductive layer in situ with the doping of the chalcogenide layer reduces contamination concerns and physical damage resulting from moving the device substrate from tool to tool, thus facilitating improved device reliability.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of forming a chalcogenide memory element having a first electrode, a second electrode, and a doped chalcogenide layer interposed between the first electrode and the second electrode, the method comprising:

forming a chalcogenide layer on the first electrode;

sputtering metal onto the chalcogenide layer using a first plasma containing at least one component gas selected from the group consisting of neon and helium, thereby forming the doped chalcogenide layer, wherein the first plasma emits a UV component sufficient to induce diffusion of the sputtered metal into the chalcogenide layer; and sputtering metal onto the doped chalcogenide layer using a second plasma containing at least one component gas having an atomic weight higher than an atomic weight of neon, thereby forming the second electrode.

2. The method of claim 1, wherein the at least one component gas having an atomic weight higher than an atomic weight of neon is argon.

3. The method of claim 1, wherein forming a chalcogenide layer further comprises forming a layer of germanium selenide material, wherein sputtering metal onto the chalcogenide layer using the first plasma further comprises sputtering silver, and wherein sputtering metal onto the doped chalcogenide layer using the second plasma also comprises sputtering silver.

4. The method of claim 1, wherein the first plasma and the second plasma are the same plasma.

5. The method of claim 1, wherein the second electrode has a different work function ($\Phi_m$) than the first electrode.

6. A method of forming a chalcogenide memory element having a first electrode, a second electrode, and a doped chalcogenide layer interposed between the first electrode and the second electrode, the method comprising:

forming a chalcogenide layer on the first electrode;

sputtering metal onto the chalcogenide layer using a first plasma containing at least one component gas selected from the group consisting of neon and helium, thereby forming the doped chalcogenide layer; and sputtering metal onto the doped chalcogenide layer using a second plasma containing at least argon, thereby forming the second electrode.

7. A method of forming a chalcogenide memory element having a first electrode, a second electrode, and a doped chalcogenide layer interposed between the first electrode and the second electrode, the method comprising:

forming a chalcogenide layer on the first electrode;

sputtering metal onto the chalcogenide layer using a plasma containing at least one component gas selected from the group consisting of neon and helium, thereby forming the doped chalcogenide layer; and sputtering metal onto the doped chalcogenide layer using the plasma, thereby forming the second electrode.

8. A method of forming a chalcogenide memory element having a first electrode, a second electrode, and a doped chalcogenide layer interposed between the first electrode and the second electrode, the method comprising:

forming a chalcogenide layer on the first electrode;

sputtering metal onto the chalcogenide layer using a plasma initially generated from feed gas containing at least one component gas selected from the group consisting of neon and helium, thereby forming the doped chalcogenide layer;

increasing an average atomic weight of the feed gas used to generate the plasma; and sputtering metal onto the doped chalcogenide layer using the plasma generated from the feed gas having the increased average atomic weight, thereby forming the second electrode.

9. The method of claim 8, wherein increasing an average atomic weight of the feed gas used to generate the plasma further comprises evacuating the feed gas after forming the doped chalcogenide layer and generating the plasma used for forming the second electrode using the feed gas having the higher average atomic weight.

10. The method of claim 8, wherein increasing an average atomic weight of the plasma further comprises modifying feed rates of component gases into the plasma while sputtering metal.

11. A method of forming a chalcogenide memory element having a first electrode, a second electrode, and a doped chalcogenide layer interposed between the first electrode and the second electrode, the method comprising:

forming a chalcogenide layer on the first electrode;

sputtering metal onto the chalcogenide layer using a first plasma in a deposition chamber to form the doped chalcogenide layer, wherein the first plasma is generated using at least one component gas selected from the group consisting of neon and helium; and sputtering metal onto the doped chalcogenide layer using a second plasma in the deposition chamber to form the second electrode, wherein the second plasma is generated using at least one component gas having an atomic weight higher than an atomic weight of neon.

12. The method of claim 11, wherein the at least one component gas used in generating the first plasma consists essentially of neon.

13. The method of claim 11, wherein the at least one component gas used in generating the second plasma consists essentially of argon.

14. The method of claim 13, wherein the second plasma is generated using at least argon.

15. The method of claim 11, wherein sputtering metal onto the doped chalcogenide layer to form the second electrode is performed in situ with sputtering metal onto the chalcogenide layer to form the doped chalcogenide layer.

16. The method of claim 11, wherein sputtering metal onto the chalcogenide layer to form the doped chalcogenide layer further comprises sputtering from a metal target and wherein sputtering metal onto the doped chalcogenide layer to form the second electrode further comprises sputtering from the same metal target.

17. The method of claim 16, wherein the metal target is a silver target and the chalcogenide layer contains a germanium selenide material.

18. The method of claim 11, wherein the first plasma and the second plasma each contain at least one component gas selected from the group consisting of neon and helium and at least one component gas having an atomic weight higher than an atomic weight of neon.

19. The method of claim 18, wherein the first plasma and the second plasma have the same composition.

20. A method of forming a chalcogenide memory element having a first electrode, a second electrode, and a doped chalcogenide layer interposed between the first electrode and the second electrode, the method comprising:

forming a chalcogenide layer on the first electrode;

sputtering silver onto the chalcogenide layer using a first plasma generated from a feed gas consisting essentially of neon, thereby forming the doped chalcogenide layer; and sputtering a metal onto the doped chalcogenide layer using a second plasma generated from a feed gas consisting essentially of argon, thereby forming the second electrode, wherein the second electrode has a different work function ($\Phi_m$) than the first electrode.

21. A method of forming a chalcogenide memory element having a first electrode, a second electrode, and a doped chalcogenide layer interposed between the first electrode and the second electrode, the method comprising:

forming a chalcogenide layer on the first electrode;

sputtering silver onto the chalcogenide layer using a first plasma consisting essentially of neon, thereby forming the doped chalcogenide layer; and sputtering silver onto the doped chalcogenide layer using a second plasma consisting essentially of argon, thereby forming the second electrode.

22. The method of claim 21, wherein the chalcogenide layer is a germanium selenide material.

* * * * *